United States Patent
Ikisawa et al.

(10) Patent No.: US 8,007,693 B2
(45) Date of Patent: Aug. 30, 2011

(54) ZINC OXIDE BASED TRANSPARENT ELECTRIC CONDUCTOR, SPUTTERING TARGET FOR FORMING OF THE CONDUCTOR AND PROCESS FOR PRODUCING THE TARGET

(75) Inventors: Masakatsu Ikisawa, Ibaraki (JP); Masataka Yahagi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 375 days.

(21) Appl. No.: 12/307,380

(22) PCT Filed: May 23, 2007

(86) PCT No.: PCT/JP2007/060487
§ 371 (c)(1), (2), (4) Date: Jan. 5, 2009

(87) PCT Pub. No.: WO2008/023482
PCT Pub. Date: Feb. 28, 2008

(65) Prior Publication Data
US 2009/0200525 A1    Aug. 13, 2009

(30) Foreign Application Priority Data
Aug. 24, 2006 (JP) ................. 2006-227720
Jan. 31, 2007 (JP) ................. 2007-020338

(51) Int. Cl.
H01B 1/08    (2006.01)
B05D 5/12    (2006.01)
(52) U.S. Cl. ............... 252/519.51; 204/298.13
(58) Field of Classification Search ............. 252/519.51; 204/298.13
See application file for complete search history.

(56) References Cited

U.S. PATENT DOCUMENTS
5,672,427 A    9/1997 Hagiwara et al.
(Continued)

FOREIGN PATENT DOCUMENTS
JP    2007-302508    * 11/2007
(Continued)

OTHER PUBLICATIONS
One Page English Language Abstract of JP 2002-075062, Mar. 15, 2002.
(Continued)

*Primary Examiner* — Mark Kopec
(74) *Attorney, Agent, or Firm* — Howson & Howson LLP

(57) ABSTRACT

Provided is a zinc oxide transparent electric conductor having zinc oxide (ZnO) as its principal component, containing an element to become an n-type dopant to zinc oxide, containing metal M in which P(P=(G+H mix)/RT, wherein G is the Gibbs free energy at temperature T of the metal, H mix is the mixing enthalpy at temperature T of zinc oxide and the metal, R is the gas constant, and T is the temperature) as a parameter showing the wettability with zinc oxide is 6 or less and in which its resistivity is smaller than the resistivity of zinc oxide added with the n-type dopant, and wherein concentration of metal M in relation to the total atomicity of zinc and the n-type dopant and metal M, which are all metal atoms configuring the zinc oxide transparent electric conductor, is 0.05 to 2.0 at %. In the development of a transparent electric conductor that does not contain raw material In which is expensive and with concern of resource depletion, provided is a low resistivity transparent electric conductor by exceeding the limits of the conventional development technique of the single dopant method, presenting guidelines for selecting a secondary additive material effective in achieving low resistivity, and indicating types of specific materials and the appropriate concentration range.

18 Claims, 3 Drawing Sheets

U.S. PATENT DOCUMENTS

| | | | |
|---|---|---|---|
| 6,528,442 | B1 | 3/2003 | Kuwano et al. |
| 6,569,548 | B2 | 5/2003 | Yamamoto et al. |
| 7,279,211 | B2 | 10/2007 | Yahagi et al. |
| 7,635,440 | B2 * | 12/2009 | Hosono et al. ............ 252/519.51 |
| 7,651,640 | B2 * | 1/2010 | Fukatani et al. ......... 252/519.51 |
| 7,686,985 | B2 * | 3/2010 | Osada ...................... 252/519.51 |
| 7,699,965 | B2 * | 4/2010 | Ikisawa et al. ........... 204/298.02 |
| 7,718,095 | B2 * | 5/2010 | Hosono et al. ............ 252/519.51 |
| 2006/0147740 | A1 | 7/2006 | Hosono et al. |
| 2007/0098626 | A1 | 5/2007 | Shindo et al. |
| 2008/0299415 | A1 | 12/2008 | Hosono et al. |
| 2009/0085014 | A1 | 4/2009 | Ikisawa et al. |

FOREIGN PATENT DOCUMENTS

| | | |
|---|---|---|
| WO | 2007/000867 A1 | 1/2007 |
| WO | 2007/000878 A1 | 1/2007 |

OTHER PUBLICATIONS

One Page English Language Abstract of JP 04-219359, Aug. 10, 1992.

One Page English Language Abstract of JP 61-205619, Sep. 11, 1986.

One Page English Language Abstract of JP 09-320344, Dec. 12, 1997.

Unpublished Co-Pending U.S. Appl. No. 11/993,944, which is the national phase of PCT/JP2006/311270 filed Jun. 6, 2006.

Unpublished Co-Pending U.S. Appl. No. 11/994,025, which is the national phase of PCT/JP2006/310734 filed May 30, 2006.

Unpublished Co-Pending U.S. Appl. No. 12/094,024, which is the national phase of PCT/JP2006/322944 filed Nov. 17, 2006.

Unpublished Co-Pending U.S. Appl. No. 12/282,933, which is the national phase of PCT/JP2007/052928 filed Feb. 19, 2007.

Sumiya et al., "SIMS Analysis of ZnO Films co-doped with N and Ga by Temperature Gradient Pulsed Laser Deposition", Applied Surface Science 223, pp. 206-209, 2004.

Gopalakrishnan et al., "Comparison of Zno:GaN film on Si(111) and Si(100) Substrates by Pulsed Laser Deposition", Physica B 376-377, pp. 756-759, 2006.

Yuan et al., "p-Type Conduction in AL-N co-doped ZnO Films", Materials Letters 58, pp. 3741-3744, Aug. 19, 2004.

Look et al., "The Future of ZnO Light Emitters", Phys. Stan. Sol. (a) 201, No. 10, pp. 2203-2212, Jul. 22, 2004.

* cited by examiner

ZINC OXIDE BASED TRANSPARENT ELECTRIC CONDUCTOR, SPUTTERING TARGET FOR FORMING OF THE CONDUCTOR AND PROCESS FOR PRODUCING THE TARGET

BACKGROUND OF THE INVENTION

The present invention relates to a zinc oxide transparent electric conductor having zinc oxide as its primary component, a sputtering target for forming the foregoing transparent electric conductor, and a method of producing the foregoing target. The term "transparent electric conductor" as used herein includes a transparent electric conductive film.

Today, the material used most as a transparent electrode of flat panel displays and the like is ITO (Indium Tin Oxide), which is obtained by doping indium oxide ($In_2O_3$) with an appropriate amount of tin (Sn). The reason why ITO plays the leading part in a transparent electric conductor is that the various characteristics of ITO such as low resistivity and high transmittance in the visible light region, which are required in a transparent electric conductor, are superior in comparison to transparent electric conductors prepared from other materials.

Nevertheless, indium (In) as the raw material to be used in ITO entails problems in that the cost of the end product will increase because indium is expensive, and the supply of materials may be feared for resource depletion because indium is a scarce resource. Although the development of a zinc oxide transparent electric conductor having zinc oxide as its primary component is being actively developed for the substitute material of ITO, there is still a problem in that the resistivity is significantly high in comparison to ITO.

The reason for this is that the conventional development policy of zinc oxide transparent electric conductive materials was mostly based on the search of a single dopant. In other words, the foregoing policy is to find an element in a periodical table that will serve as an n-type dopant and emit electrons as a result of doping the zinc oxide as the parent material with such element. Specifically, for example, in most cases, a target doped with a candidate element having an atomic valence that is greater than bivalence, which is the valence of zinc, in an appropriate range of concentration is prepared, and this is subject to sputter-deposition to evaluate the resistivity of the film.

As a result of this development policy, various candidate dopants having an atomic valence of trivalence (refer to Patent Document 1) and tetravalence (refer to Patent Document 2) were discovered, and the most appropriate are gallium (Ga) and aluminum (Al). Even with a zinc oxide transparent electric conductor added with the foregoing elements, however, the actual condition is that the resistivity of such candidate dopants is far inferior to ITO.

Consequently, in recent years, attempts are being made for adding another type of element or compound in addition to the n-type dopant to zinc oxide. For example, Patent Document 3 describes that adding silver to zinc oxide and oxide of an element having trivalence is effective for achieving low resistivity of the transparent electric conductive film, but with this method the resistivity reduction effect is insufficient.

Moreover, Patent Document 4 describes a method of obtaining the intended etching speed by co-doping zinc oxide with an n-type dopant and cobalt (Co) or vanadium (V) and controlling the chemical properties, but it is described that the resistivity of the zinc oxide film obtained with this method increases according to the increase in concentration of the added cobalt or the like, and is not intended to reduce the resistivity.

[Patent Document 1] Japanese Patent Laid-Open Publication No. S61-205619
[Patent Document 2] Japanese Patent Laid-Open Publication No. S62-154411
[Patent Document 3] Japanese Patent Laid-Open Publication No. H9-320344
[Patent Document 4] Japanese Patent Laid-Open Publication No. 2002-75062

SUMMARY OF THE INVENTION

As described above, the search for an optimal single dopant in the development of a zinc oxide transparent electric conductor as the substitute material of ITO that does not contain In, which is an expensive raw material with concern of resource depletion, has already reached its limit. In addition, even if a certain type of metal is added for the mere reason that its resistivity is lower than the zinc oxide added with an n-type dopant without considering the other properties, the resistivity not only remains high if such metal is added in high concentration, but it will also lead to deteriorate the transmittance, which is an important property as a transparent electric conductor.

Meanwhile, the resistivity reduction effect will be insufficient if a certain type of metal is added in a low concentration. The present invention was devised in view of the foregoing circumstances. Thus, an object of the present invention is to provide a zinc oxide transparent electric conductive film of low resistivity comparable to ITO.

As a result of intense study to overcome the foregoing problems, the present inventors succeeded in further reducing the resistivity of a zinc oxide transparent electric conductive film by focusing on the wettability with zinc oxide regarding the metal to be added to such zinc oxide, selecting a metal in which the parameter of the correlation of wettability is an appropriate value, and adding such metal to zinc oxide.

A carrier is generated by adding an n-type dopant to zinc oxide and current flows by moving such carrier, and the way to lower the resistivity is either the carrier concentration to be increased or the mobility to be increased. Nevertheless, if the carrier concentration is too high, the transmission of the film in a long-wavelength region that is greater than the wavelength prescribed in plasma frequency will deteriorate.

The current carrier concentration of a zinc oxide transparent electric conductor has reached nearly the upper limit of the visible light range, and any more increase would not be effective for the increase of carrier concentration. Contrarily, if any more n-type dopant is added, the adverse effect of not generating a carrier will become the cause of neutral impurity scattering, and deterioration at the mobility will be more significant.

Accordingly, in order to reduce the resistivity, it is effective to increase the mobility, and a method of growing film at a high temperature in order to improve the crystallinity may be considered. However, the temperature during deposition is limited to the maximum temperature in which the substrate or the like can be heated, which is usually around 200° C., and 300° C. at highest, and high temperature deposition at a temperature higher than the foregoing temperature is unsuitable.

Under these circumstances, the present inventors focused on the fact that the cause of the improvement of mobility obstructed is the grain boundary between the crystal grains in the zinc oxide film and, although the electrons have a certain level of mobility in the crystal grains, they are subject to scattering at the crystal grain boundary which leads to the deterioration in mobility, and the overall mobility also deteriorates thereby. Thus, the present inventors get an idea of inhibiting the deterioration in mobility by adding a metal element, which has lower resistivity than the zinc oxide transparent electric conductor, to the crystal grain boundary.

Nonetheless, here, if a metal element is simply added as described in Patent Document 3 in an attempt to lower the overall resistivity based on the concentration average of the overall metal resistivity and the resistivity of zinc oxide, the effect of achieving low resistivity will be insufficient if the metal additive amount is small. If the metal concentration is increased to achieve lower resistivity, the metal infiltrates into the crystal grains and disturbs the zinc oxide crystal alignment, causes deterioration in mobility, increases the resistivity, and the transmittance of the film will also deteriorate since the metal itself is not transparent.

Accordingly, as the condition for selecting the metal to be added in this situation, the mere condition that has low resistivity will be insufficient to realize the status of adding a metal element to the grain boundary as intended by the present invention. Thus, in order to examine which metal elements can be easily added to the grain boundary of the zinc oxide, the present inventors conducted tests of adding various metals to zinc oxide, examined the correlation of the type of added metal and the film resistivity, discovered metals that are effective and ineffective for achieving low resistivity. The intensive study leads to the cause thereof by examining the properties of the metals themselves and the properties in the correlation of the metal and zinc oxide, and came to conclusion that the cause thereof is the wettability of the metal to be added and the zinc oxide.

In other words, with metals that have inferior wettability with zinc oxide, even if such metals are added to zinc oxide, they are pushed out from the grain boundary and unnecessarily remain in a large amount at a part of such grain boundary, and contrarily such metals will not be added to the other grain boundaries. Meanwhile, when metals with favorable wettability with zinc oxide are added, the metals get across the enter grain boundary, and it is thereby possible to realize the status of adding metals to the grain boundary as intended by the present invention. In other words, the present invention adds metal in addition to an n-type dopant to zinc oxide, and the role of such metal is to have favorable wettability with zinc oxide so as to realize the selective alignment to the grain boundary of zinc oxide, increase in mobility as a result of inhibiting the grain boundary scattering, and reduction in resistivity based on the synergy effect of the high carrier concentration of the metal itself.

Based on the foregoing discovery, the present invention provides a zinc oxide transparent electric conductor having zinc oxide (ZnO) as its principal component, containing an element to become an n-type dopant to zinc oxide, containing metal M in which $P(P=(\Delta G^0+\Delta Hx(M))/RT$, wherein $\Delta G^0$ is the standard free energy change of redox reaction of metal M and zinc oxide, $\Delta Hx(M)$ is the heat of dissolution of zinc as a constituent metal element of zinc oxide to metal M, R is the gas constant, and T is the temperature) as a parameter showing the wettability with zinc oxide is 6 or less and in which its resistivity is smaller than the resistivity of zinc oxide added with the n-type dopant, and wherein concentration of metal M in relation to the total atomicity of zinc and the n-type dopant and metal M, which are all metal atoms configuring the zinc oxide transparent electric conductor, is 0.05 to 2.0 at %.

What is particularly important in the present invention is that the metal with favorable wettability in which a parameter showing the wettability with zinc oxide is within a prescribed range is contained in a prescribed concentration range, which is relatively a small amount.

In the foregoing zinc oxide transparent electric conductor, the n-type dopant may be gallium (Ga) in which the concentration in relation to the total atomicity of zinc oxide and Ga is 3 to 6 at %. In addition, the n-type dopant may be aluminum (Al) in which the concentration in relation to the total atomicity of zinc oxide and Al is 0.5 to 3.5 at %.

Although both of these n-type dopants are appropriate, other dopants may also be used so long as they are able to achieve the object of the present invention, The present invention covers all of such dopants. The metal M, cobalt (Co), nickel (Ni), iron (Fe) or copper (Cu) is particularly effective, and it is effective to use one or more types of elements selected from the foregoing metal elements.

The present invention further provides a sputtering target for forming a zinc oxide transparent electric conductor having zinc oxide (ZnO) as its principal component, containing an element to become an n-type dopant to zinc oxide, containing metal M in which $P(P=(\Delta G^0+\Delta Hx(M))/RT$, wherein $\Delta G^0$ is the standard free energy change of redox reaction of metal M and zinc oxide, $\Delta Hx(M)$ is the heat of dissolution of zinc as a constituent metal element of zinc oxide to metal M, R is the gas constant, and T is the temperature) as a parameter showing the wettability with zinc oxide is 6 or less and in which its resistivity is smaller than the resistivity of zinc oxide added with the n-type dopant, and wherein concentration of metal M in relation to the total atomicity of zinc and the n-type dopant and metal M, which are all metal atoms configuring the zinc oxide transparent electric conductor, is 0.05 to 2.0 at %.

Gallium (Ga) may be used as the n-type dopant of the foregoing target, and the concentration in relation to the total atomicity of zinc oxide and Ga is preferably 3 to 6 at %. Aluminum (Al) may also be used as the n-type dopant.

Here, the concentration in relation to the total atomicity of zinc oxide and Al is set to 0.5 to 3.5 at %. As the metal M, cobalt (Co), nickel (Ni), iron (Fe) or copper (Cu) is particularly effective, and it is effective to use one or more types of elements selected from the foregoing metal elements.

Upon forming a zinc oxide transparent electric conductor, by forming a solid sputtering target having the same composition as the composition of the zinc oxide transparent electric conductor and sputtering such sputtering target, the components of the target are reflected in the deposition, and it is thereby possible form a zinc oxide transparent electric conductor having roughly the same component composition.

The present invention additionally provides a method producing a sputtering target for forming a zinc oxide transparent electric conductor having zinc oxide (ZnO) as its principal component, including the steps of respectively weighing raw material powders of zinc oxide powder, oxide powder of an element to become an n-type dopant to zinc oxide, and powder of metal M in which $P(P=(\Delta G^0+\Delta Hx(M))/RT$, wherein $\Delta G^0$ is the standard free energy change of redox reaction of metal M and zinc oxide, $\Delta Hx(M)$ is the heat of dissolution of zinc as a constituent metal element of zinc oxide to metal M, R is the gas constant, and T is the temperature) as a parameter showing the wettability with zinc oxide is 6 or less and in which its resistivity is smaller than the resistivity of zinc oxide added with the n-type dopant so that concentration of metal M in relation to the total atomicity of zinc and the n-type dopant and metal M, which are all metal atoms configuring the zinc oxide transparent electric conductor, becomes 0.05 to 2.0 at %, mixing the powders, and performing pressure sintering thereto in order to form a solid target.

In this method of producing a sputtering target for forming a zinc oxide transparent electric conductor, gallium (Ga) can be used as the n-type dopant, and gallium oxide powder may be mixed so that the concentration in relation to the total atomicity of zinc oxide and Ga will be 3 to 6 at %.

Further, aluminum (Al) can be used as the n-type dopant, and aluminum oxide powder may be mixed so that the concentration in relation to the total atomicity of zinc oxide and Al will be 0.5 to 3.5 at %. In addition, one or more types of powders selected from cobalt (Co) powder, nickel (Ni) powder, iron (Fe) powder or copper (Cu) powder may be used as metal M.

The wettability being favorable means that, generally speaking, when the droplets on a solid substrate have a certain contact angle with the solid substrate, such contact angle is small, and a material has been disclosed regarding the relationship of wettability and parameter P defined by the present invention (Ferrum Vol. 8 (2003), No. 4 Reprint, Thermodynamics of System including Surface, p15 to p21, The Iron and Steel Institute of Japan).

The foregoing material describes that, although the parameter P and wettability are not correlated to the point that they completely correspond one-to-one, there is no material in which the parameter P is large and the contact angle is small; that is, there is no material with favorable wettability. In other words, whether the wettability is favorable or not can be evaluated based on the parameter P.

The symbols used in this parameter are now explained. G is the standard free energy change of redox reaction of metal and zinc oxide and, when the temperature T is decided, it can be calculated from the relationship with zinc oxide for each metal M. $\Delta Hx(M)$ is the heat of dissolution of zinc as a constituent metal element of zinc oxide to metal M and, if the metal M and temperature are specified, it can also be calculated from the relationship with zinc oxide. R is the gas constant, and is a constant value having the value of 8.314 (J/K·mol). T is the temperature, and a value of 1800° C. is used upon calculating the parameter value.

The reason T is calculated as this kind of high temperature is because, during the sputtering, the constituent elements of the target will become a plasma state and reach the substrate and thereby form the film. If this temperature is only going to be used for comparing the types of appropriate metals, the magnitude correlation of the parameter value obtained as a result will hardly be different even if the temperature deviates slightly from 1800° C., and, therefore, a different value (temperature) may also be used. Nevertheless, the present invention uses the constant value of 1800° C. in order to define the parameter value to be within a prescribed range.

As a result of specifying zinc oxide and metals as described above, it will be possible to calculate the parameter P. For example, the value of P for cobalt (Co), nickel (Ni), and silver (Ag) is 3.5, 5.4, and 14.3, respectively. Thus, the parameter P values of Co and Ni are smaller than 6, and in particular Co has the smallest parameter P value among the three metal elements, and therefore Co satisfies the condition of the metal with favorable wettability when added to zinc oxide the most.

Meanwhile, with respect to the relationship of zinc oxide and Co, Patent Document 4 describes a transparent electric conductive film in which an n-type dopant and Co were added to zinc oxide. Here, however, the purpose of adding Co is to control the chemical properties of the overall zinc oxide film to slow the etching speed consequently. In the Examples disclosed in Patent Document 4, if Co is added, the description simply states that the resistivity of the film increases with the Co concentration, and there is no description regarding the effect of lowering the resistivity. The reason for this is that the Co additive amount in these Examples is too large for the objective of reducing the resistivity, and the mode of adding Co is $CoCl_2$; that is, chloride, and Co is of a bivalent status in the zinc oxide film.

The reason why low resistivity is achieved by adding Co in the present invention is that the upper limit of the added Co concentration is a relatively low concentration at 2.0 at %, the mode of Co is of a non-oxidized metallic state, its high free electron concentration is utilized, and the most important property is that the wettability of Co and zinc oxide is favorable.

Accordingly, although Patent Document 4, for form's sake, describes a transparent electric conductive film containing zinc oxide, an n-type dopant and Co, there is no recognition regarding the knowledge on wettability of Co and zinc oxide or the appropriate concentration range thereof, or the knowledge of being able to lower the resistivity of the zinc oxide transparent electric conductor by controlling this to be within an appropriate range, this kind of technical concept was first discovered by the present invention.

The present invention yields an effect of dramatically increasing the electrical conductivity of the overall zinc oxide transparent electric conductor by adding an appropriate concentration of metal with low resistivity and with favorable wettability with zinc oxide to the zinc oxide transparent electric conductor added with an n-type dopant, and selectively aligning such metal at the crystal grain boundary, and thereby obtaining a zinc oxide transparent electric conductive film having low resistivity that is comparable to ITO.

Accordingly, it is possible to provide a low resistivity transparent electric conductor that has not been realized with a conventional material to substitute for ITO containing zinc oxide without having to use In, which is an expensive raw material with concern of resource depletion.

DETAILED DESCRIPTION OF THE INVENTION

Figure 1:
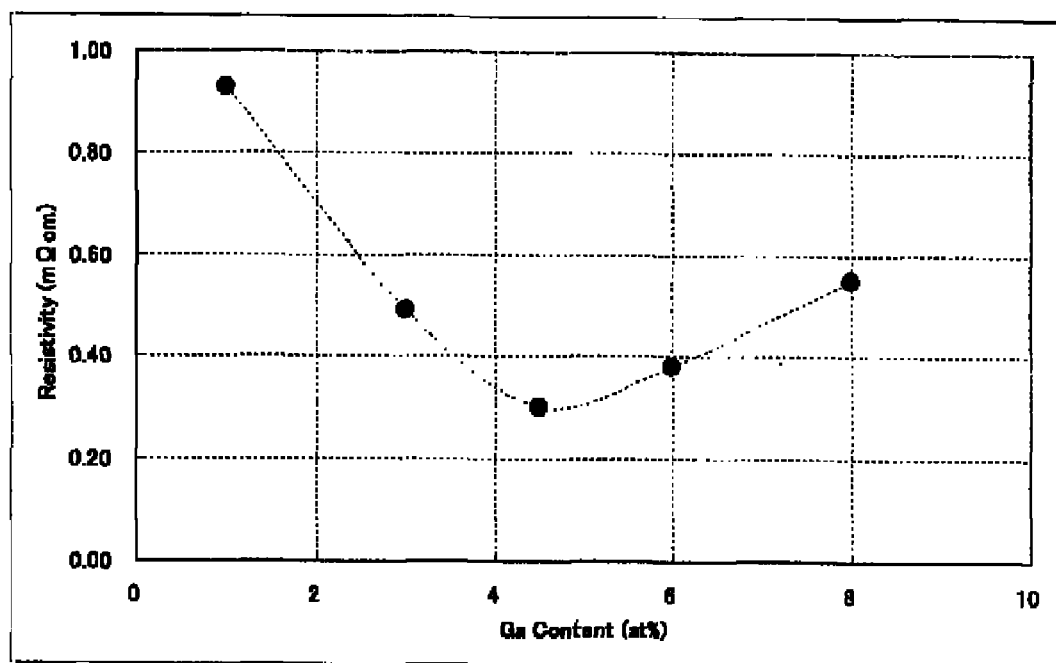
FIG. 1 is a diagram of the correlation of the Ga concentration and resistivity.

With the transparent electric conductor of the present invention, by adding zinc oxide, an n-type dopant and appropriate amount of metal, sintering this and preparing a sputtering target, and evaluating the resistivity and transmittance of the film obtained by sputtering the foregoing sputtering target, the appropriate concentration range of the n-type dopant and metal can be sought.

By adding an n-type dopant to zinc oxide, the electrons supplied from the dopant become the carrier allowing the current to flow smoother, and lowering the resistivity. Here, as candidates of the n-type dopant, elements that are trivalent or quadrivalent having a greater valency than zinc are used since they need to enter into the lattice location of zinc and discharge the electrons, and Ga and Al are the most appropriate from the perspective that the electrons are discharged easily and the impurity level of the element to become the dopant.

When using Ga, if the concentration in relation to the total atomicity of zinc oxide and Ga is less than 3 at %, the electron concentration to be discharged from the dopant will not be sufficiently high, and there is only a small resistivity reduction effect. However, if the concentration exceeds 6 at %, the Ga will not be ionized and remain neutral, will not discharge the electrons and exist in the zinc oxide and cause interference with electron transport, lower the mobility, and consequently increase the resistivity. Accordingly, the appropriate value of the Ga concentration as the n-type dopant is within the range of 3 to 6 at % in relation to the total atomicity of zinc oxide and Ga. According to similar reasons, the appropriate value of the Al concentration as the n-type dopant is within the range of 0.5 to 3.5 at %.

Moreover, if the concentration of the metal to be added to improve the wettability is less than 0.05 at % in relation to the total atomicity of zinc and the n-type dopant and metal M, which are all metal atoms configuring the zinc oxide transparent electric conductor, the effect of improving the wettability will be small. To the contrary, if the concentration exceeds 2 at %, not only will the metal not be selectively aligned in the grain boundary, it will also infiltrate into the crystal grain boundary, disturb the crystallinity, deteriorate the mobility, and consequently increase the resistivity.

Moreover, since metal, unlike zinc oxide, possesses conductivity but is not transparent, if such metal is added in high concentration, the transmittance will decrease, and the transparency that should possess transparent conductivity will deteriorate. Accordingly, the concentration of the metal to be added should be within the appropriate range of 0.05 to 2 at % in relation to the total atomicity of zinc and the n-type dopant and metal M, which are all metal atoms configuring the zinc oxide transparent electric conductor.

In order to prepare the zinc oxide transparent electric conductor of the present invention, a physical vapor-deposition method can be used. A physical vapor-deposition method includes the evaporation method, the reactive plasma evaporation method, the sputtering method, the laser abrasion method and so on, but the sputtering method is most suitable since it is able to perform a relatively uniform deposition on a large area, has minimal variation in the target composition and film composition, and has superior productivity.

The target obtained by the sputtering method may be formed into a solid target, but it is also possible to combine a mosaic target, or independently arrange and sputter the respective targets of zinc oxide, n-type dopant, and metal so as to ultimately set the film composition to be within a prescribed range.

EXAMPLES

The present invention is now explained in detail with reference to the Examples. These Examples are merely illustrative, and the present invention shall in no way be limited thereby. In other words, various modifications and other embodiments based on the technical spirit claimed in the claims shall be included in the present invention as a matter of course.

Example 1

(Characteristics Confirmation Test 1)

The respective raw material powders of zinc oxide and gallium oxide ($Ga_2O_3$) were weighed so that the atomicity ratio of ZnO and Ga as their constituent elements will be, as shown in sample numbers 1 to 5 of Table 1, in the range of ZnO:Ga=99.00 to 92.00:1.000 to 8.000. In other words, the atomic concentration ratio of Ga in relation to the total of Ga and ZnO is changed from 1.000 to 8.000 at %. The specific weights of the respective raw materials weighed can be easily sought based on the calculation from the foregoing atomicity ratio and molecular weight of each of the raw materials to be weighed.

After mixing the weighed raw materials, a zirconia ball having a diameter of 3 mm was used and the raw material powders were pulverized for approximately one hour with an attritor, sieved with a 60-mesh sieve, retained in a drying oven set to 120° C. for 24 hours, and the moisture in the raw materials was evaporated. The dried raw materials were additionally sieved with a 60-mesh sieve, and mixed for approximately 5 minutes with a warming blender so that the raw material powders were mixed uniformly in a sufficient manner.

Subsequently, 270 g of the mixed raw materials powders was filled in a small die having a diameter of 85 φmm, the temperature was increased at a rate of temperature increase of 10° C./min from room temperature to 950° C. and at a rate of temperature increase of 5° C./min from 950° C. to 1000° C. while flowing argon (Ar) gas, and, after the temperature reached 1000° C., the mixed raw material powders were retained as is for 30 minutes, and pressurized from a pressure of 0 to 300 kgf/cm² in 10 minutes.

Then, after retaining the status of a temperature of 1000° C. and pressure of 300 kgf/cm² for 2 hours, the heating with the furnace was stopped, cooled naturally, and the pressure was lowered from 300 kgf/cm² to 0 kgf/cm² in 10 minutes when the temperature reached 100° C. The target removed from the furnace was processed into a disk shape having a diameter of 50 mm and a thickness of 7 mm to obtain a sputtering target.

The obtained target was subject to sputter deposition using Corning #1737 glass having a diameter of 4 inches and a thickness of 0.7 mm as the substrate, and with the sputter deposition conditions at an Ar atmosphere of 0.5 Pa, Ar flow rate of 12 sccm, substrate temperature of 200° C., distance between the substrate and target of 80 mm, and sputter power of 50 W, and by adjusting the deposition time so that the film thickness becomes approximately 150 nm. The film thickness of the obtained film was measured with a profilometer, and the film resistivity was evaluated with Hall measurement. The obtained results are shown in sample numbers 1 to 5 of Table 1.

TABLE 1

Data of Characteristics Confirmation (Ga Dopant)

| Sample Number | ZnO Content [at %] | Ga Content [at %] | Co Content [at %] | Ni Content [at %] | Fe Content [at %] | Cu Content [at %] | Ag Content [at %] | Resistivity [mΩcm] |
|---|---|---|---|---|---|---|---|---|
| 1 | 99.00 | 1.000 | 0 | 0 | 0 | 0 | 0 | 0.93 |
| 2 | 97.00 | 3.000 | 0 | 0 | 0 | 0 | 0 | 0.49 |
| 3 | 95.50 | 4.500 | 0 | 0 | 0 | 0 | 0 | 0.30 |
| 4 | 94.00 | 6.000 | 0 | 0 | 0 | 0 | 0 | 0.38 |

TABLE 1-continued

Data of Characteristics Confirmation (Ga Dopant)

| Sample Number | ZnO Content [at %] | Ga Content [at %] | Co Content [at %] | Ni Content [at %] | Fe Content [at %] | Cu Content [at %] | Ag Content [at %] | Resistivity [mΩcm] |
|---|---|---|---|---|---|---|---|---|
| 5 | 92.00 | 8.000 | 0 | 0 | 0 | 0 | 0 | 0.55 |
| 6 | 95.48 | 4.499 | 0.02 | 0 | 0 | 0 | 0 | 0.28 |
| 7 | 95.45 | 4.498 | 0.05 | 0 | 0 | 0 | 0 | 0.22 |
| 8 | 95.31 | 4.491 | 0.20 | 0 | 0 | 0 | 0 | 0.18 |
| 9 | 94.55 | 4.455 | 1.00 | 0 | 0 | 0 | 0 | 0.21 |
| 10 | 93.59 | 4.410 | 2.00 | 0 | 0 | 0 | 0 | 0.26 |
| 11 | 92.64 | 4.365 | 3.00 | 0 | 0 | 0 | 0 | 0.38 |
| 12 | 95.48 | 4.499 | 0 | 0.02 | 0 | 0 | 0 | 0.29 |
| 13 | 95.45 | 4.498 | 0 | 0.05 | 0 | 0 | 0 | 0.28 |
| 14 | 95.31 | 4.491 | 0 | 0.20 | 0 | 0 | 0 | 0.26 |
| 15 | 94.55 | 4.455 | 0 | 1.00 | 0 | 0 | 0 | 0.28 |
| 16 | 93.59 | 4.410 | 0 | 2.00 | 0 | 0 | 0 | 0.29 |
| 17 | 92.64 | 4.365 | 0 | 3.00 | 0 | 0 | 0 | 0.45 |
| 18 | 95.48 | 4.499 | 0 | 0 | 0.02 | 0 | 0 | 0.28 |
| 19 | 95.45 | 4.498 | 0 | 0 | 0.05 | 0 | 0 | 0.24 |
| 20 | 95.31 | 4.491 | 0 | 0 | 0.20 | 0 | 0 | 0.22 |
| 21 | 94.55 | 4.455 | 0 | 0 | 1.00 | 0 | 0 | 0.25 |
| 22 | 93.59 | 4.410 | 0 | 0 | 2.00 | 0 | 0 | 0.27 |
| 23 | 92.64 | 4.365 | 0 | 0 | 3.00 | 0 | 0 | 0.40 |
| 24 | 95.48 | 4.499 | 0 | 0 | 0 | 0.02 | 0 | 0.28 |
| 25 | 95.45 | 4.498 | 0 | 0 | 0 | 0.05 | 0 | 0.25 |
| 26 | 95.31 | 4.491 | 0 | 0 | 0 | 0.20 | 0 | 0.23 |
| 27 | 94.55 | 4.455 | 0 | 0 | 0 | 1.00 | 0 | 0.26 |
| 28 | 93.59 | 4.410 | 0 | 0 | 0 | 2.00 | 0 | 0.27 |
| 29 | 92.64 | 4.365 | 0 | 0 | 0 | 3.00 | 0 | 0.41 |
| 30 | 95.48 | 4.499 | 0 | 0 | 0 | 0 | 0.02 | 0.36 |
| 31 | 95.45 | 4.498 | 0 | 0 | 0 | 0 | 0.05 | 0.45 |
| 32 | 95.31 | 4.491 | 0 | 0 | 0 | 0 | 0.20 | 0.55 |
| 33 | 94.55 | 4.455 | 0 | 0 | 0 | 0 | 1.00 | 0.75 |
| 34 | 93.59 | 4.410 | 0 | 0 | 0 | 0 | 2.00 | 0.85 |
| 35 | 92.64 | 4.365 | 0 | 0 | 0 | 0 | 3.00 | 0.98 |

When adding gallium to zinc oxide, it is possible to review the transition of the film resistivity. As shown in sample numbers 1 to 5 of Table 1, when the Ga content is 1.000 at %, the film resistivity is 0.93 mΩcm and the resistivity is high. Nevertheless, the film resistivity decreases in accordance with the increase of the Ga content, and, when the Ga content is 4.500 at %, the film resistivity was lowest at 0.30 mΩcm. Subsequently, the film resistivity increased as a result of increasing the Ga content, and the film resistivity became 0.55 mΩcm with the Ga content at 8.000 at %. FIG. 1 is a graph showing the results.

Like this, it is evident that the addition of an appropriate amount of gallium to zinc oxide is extremely useful in decreasing the film resistivity. Nevertheless, if the additive amount is small, or excessive, the foregoing Characteristics Confirmation Test shows that it does not contribute to the reduction of the film resistivity. Then, as shown in sample numbers 1 to 5 of Table 1 and in FIG. 1, it was found that the effective amount of gallium to be added is 3 to 6 at %, and the most effective amount of gallium to be added is 4.500 at %. (Characteristics Confirmation Test 2)

The foregoing Characteristics Confirmation Test 1 confirmed that the addition of gallium to zinc oxide is extremely effective for decreasing the film resistivity, and the most effective amount of gallium to be added is 4.500 at %. Nevertheless, even with the addition of gallium as described above, it is only possible to achieve film resistivity of roughly 0.30 mΩcm, and this is not necessarily the level of resistivity that is comparable to conventional ITO.

Thus, cobalt was added to zinc oxide and gallium as the metal of the present invention for improving the wettability. Specifically, as shown in sample numbers 6 to 11 of Table 1, the respective raw material powders of zinc oxide, gallium oxide ($Ga_2O_3$), and cobalt were weighed so that the atomicity ratio of Co in relation to the total amount of ZnO, Ga, and Co as its constituent elements was in the range of 0.02 to 3.00.

The specific weights of the respective raw materials weighed can be easily sought based on the calculation from the foregoing atomicity ratio and molecular weight of each of the raw materials to be weighed. Incidentally, here, the atomic concentration of Ga in relation to the total atomicity of Ga and ZnO was set to the optimal value of 4.500 at % based on the data of the foregoing Characteristics Confirmation Test 1.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 1. The film thickness of the obtained film was measured with a profilometer, and the film resistivity was evaluated with Hall measurement. The obtained results are also shown in Table 1.

Consequently, the resistivity became 0.28 mΩcm with the Co content at 0.02 at %, and was lower than the film resistivity of 0.30 mΩcm in the case of independently adding gallium to zinc oxide, and showed improvement. The resistivity decreased even further in accordance with the increase of the Co content, and the resistivity became the lowest value of 0.18 mΩcm with the Co content at 0.20 at %. This is a prominent example resulting from the effect of adding Co, and yielded an effect of obtaining low resistivity comparable to ITO. Subsequently, the resistivity showed an increasing trend in accordance with the increase of the Co content. Then, the resistivity became 0.26 mΩcm with the Co content at 2.00 at %.

Nevertheless, the resistivity became 0.38 mΩcm with the Co content at 3.00 at %, and became higher than the film resistivity of 0.30 mΩcm in the case of independently adding gallium to zinc oxide. Consequently, it has been found that the excessive addition of Co is not favorable. Accordingly, when adding cobalt to zinc oxide and gallium, it is desirable that the Co content to be added is 2.00 at % or less in which the effect of the addition of Co is evident, and it is clear that the lower limit of Co addition is preferably the Co content being 0.05 at % or greater in which the effect of the addition of Co is evident.

(Characteristics Confirmation Test 3)

Next, nickel was added to zinc oxide and gallium as the metal of the present invention for improving the wettability. Specifically, as shown in sample numbers 12 to 17 of Table 1, the respective raw material powders of zinc oxide, gallium oxide ($Ga_2O_3$), and nickel were weighed so that the atomicity ratio of Ni in relation to the total amount of ZnO, Ga, and Ni as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 2, the atomic concentration of Ga in relation to the total atomicity of Ga and ZnO was set to the optimal value of 4.500 at % based on the data of the foregoing Characteristics Confirmation Test 1.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 1. The film thickness of the obtained film was measured with a profilometer, and the film resistivity was evaluated with Hall measurement. The obtained results are also shown in sample numbers 12 to 17 of Table 1.

Consequently, the resistivity became 0.29 mΩcm with the Ni content at 0.02 at %, and was lower than the film resistivity of 0.30 mΩcm in the case of independently adding gallium to zinc oxide, and showed improvement. The resistivity decreased even further in accordance with the increase of the Ni content, and the resistivity became the lowest value of 0.26 mΩcm with the Ni content at 0.20 at %. Subsequently, the resistivity showed an increasing trend in accordance with the increase of the Ni content. Then, the resistivity became 0.29 mΩcm with the Ni content at 2.00 at %.

As described above, the film resistivity became 0.27 mΩcm with the Ni concentration at 0.2 at %, and showed the lowest value in the Ni concentration range, and this is a prominent example resulting from the effect of adding Ni. Accordingly, Ni also has a value of 5.4 of P as the parameter showing wettability, which is lower than the 6 prescribed by the present invention, and the resistivity reduction effect through the addition of Ni has been acknowledged. In comparison to the case of Co, although it could be said that the effect is somewhat weak, it has been confirmed that a sufficient resistivity reduction effect was still achieved.

The resistivity became 0.45 mΩcm with the Ni content at 3.00 at %, and became higher than the film resistivity of 0.30 mΩcm in the case of independently adding gallium to zinc oxide. Consequently, it has been found that the excessive addition of Ni is not favorable. Accordingly, when adding nickel to zinc oxide and gallium, it is desirable that the Ni content to be added is 2.00 at % or less in which the effect of the addition of Ni is evident, and it is clear that the lower limit of Ni addition is preferably the Ni content being 0.05 at % or greater in which the effect of the addition of Ni is evident.

(Characteristics Confirmation Test 4)

Next, iron was added to zinc oxide and gallium as the metal of the present invention for improving the wettability. Specifically, as shown in sample numbers 18 to 23 of Table 1, the respective raw material powders of zinc oxide, gallium oxide ($Ga_2O_3$), and iron were weighed so that the atomicity ratio of Fe in relation to the total amount of ZnO, Ga, and Fe as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 2, the atomic concentration of Ga in relation to the total atomicity of Ga and ZnO was set to the optimal value of 4.500 at % based on the data of the foregoing Characteristics Confirmation Test 1.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 1. The film thickness of the obtained film was measured with a profilometer, and the film resistivity was evaluated with Hall measurement. The obtained results are also shown in sample numbers 18 to 23 of Table 1.

Consequently, the resistivity became 0.28 mΩcm with the Fe content at 0.02 at %, and was lower than the film resistivity of 0.30 mΩcm in the case of independently adding gallium to zinc oxide, and showed improvement. The resistivity decreased even further in accordance with the increase of the Fe content, and the resistivity became the lowest value of 0.22 mΩcm with the Fe content at 0.20 at %. Subsequently, the resistivity showed an increasing trend in accordance with the increase of the Fe content. Then, the resistivity became 0.27 mΩcm with the Fe content at 2.00 at %.

Nevertheless, the resistivity became 0.40 mΩcm with the Fe content at 3.00 at %, and became higher than the film resistivity of 0.30 mΩcm in the case of independently adding gallium to zinc oxide. Consequently, it has been found that the excessive addition of Fe is not favorable. Accordingly, when adding iron to zinc oxide and gallium, it is desirable that the Fe content to be added is 2.00 at % or less in which the effect of the addition of Fe is evident, and it is clear that the lower limit of Fe addition is preferably the Fe content being 0.05 at % or greater in which the effect of the addition of Fe is evident.

(Characteristics Confirmation Test 5)

Next, copper was added to zinc oxide and gallium as the metal of the present invention for improving the wettability. Specifically, as shown in sample numbers 24 to 29 of Table 1, the respective raw material powders of zinc oxide, gallium oxide ($Ga_2O_3$), and copper were weighed so that the atomicity ratio of Cu in relation to the total amount of ZnO, Ga, and Cu as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 2, the atomic concentration of Ga in relation to the total atomicity of Ga and ZnO was set to the optimal value of 4.500 at % based on the data of the foregoing Characteristics Confirmation Test 1.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 1. The film thickness of the obtained film was measured with a profilometer, and the film resistivity was evaluated with Hall measurement. The obtained results are similarly shown in sample numbers 24 to 29 of Table 1.

Consequently, the resistivity became 0.28 mΩcm with the Cu content at 0.02 at %, and was lower than the film resistivity of 0.30 mΩcm in the case of independently adding gallium to zinc oxide, and showed improvement. The resistivity decreased even further in accordance with the increase of the Cu content, and the resistivity became the lowest value of 0.23 mΩcm with the Cu content at 0.20 at %. Subsequently, the resistivity showed an increasing trend in accordance with the increase of the Cu content. Then, the resistivity became 0.27 mΩcm with the Cu content at 2.00 at %.

Nevertheless, the resistivity became 0.41 mΩcm with the Cu content at 3.00 at %, and became higher than the film resistivity of 0.30 mΩcm in the case of independently adding gallium to zinc oxide. Consequently, it has been found that the excessive addition of Cu is not favorable. Accordingly, when adding iron to zinc oxide and gallium, it is desirable that the Cu content to be added is 2.00 at % or less in which the effect of the addition of Cu is evident, and it is clear that the lower limit of Cu addition is preferably the Cu content being 0.05 at % or greater in which the effect of the addition of Cu is evident.

Comparative Example 1

(Characteristics Confirmation Test 6)

Next, by way of comparison, silver was added to zinc oxide and gallium as the metal of the present invention for improving the wettability. Specifically, as shown in sample numbers 30 to 35 of Table 1, the respective raw material powders of zinc oxide, gallium oxide ($Ga_2O_3$), and silver were weighed so that the atomicity ratio of Ag in relation to the total amount of ZnO, Ga, and Ag as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 2, the atomic concentration of Ga in relation to the total atomicity of Ga and ZnO was set to the optimal value of 4.5 at % based on the data of the foregoing Characteristics Confirmation Test 1.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 1. The film thickness of the obtained film was measured with a profilometer, and the film resistivity was evaluated with Hall measurement. The obtained results are similarly shown in sample numbers 30 to 35 of Table 1.

Consequently, the resistivity became 0.36 mΩcm with the Ag content at 0.02 at %, and was higher than the film resistivity of 0.30 mΩcm in the case of independently adding gallium to zinc oxide, and was inferior. The resistivity gradually increased in accordance with the increase of the Ag content, and the resistivity became 0.98 mΩcm with the Ag content at 3.00 at %, and became higher than the film resistivity of 0.30 mΩcm in the case of independently adding gallium to zinc oxide. Consequently, it has been found that the addition of Ag is not preferable.

As described above, the film resistivity as a result of adding Ag showed a different tendency in comparison to the cases of adding Co, Ni, Fe, and Cu. In other words, in the case of Ag, since the parameter P showing the wettability is relatively high at 14.3, the wettability with zinc oxide is not favorable, and, even when added, if the addition is in high concentration, the film resistivity becomes higher in comparison to the case of not adding Ag at all. If the additive amount is reduced, the adverse effect of adding Ag gradually becomes smaller, and nears the film resistivity in the case of not adding Ag. Accordingly, based on the Comparative Examples, if the parameter of the metal to be added is large, there is no effect of addition. While the Ni parameter is 5.4, it is evident that this vicinity is close to the upper limit of yielding the effect of achieving low resistivity based on the metal effect. Then, the upper limit of the appropriate range of the parameter will be 6 as prescribed in the preset invention.

(Effect of Using Ga as N-Type Dopant and Adding Co, Ni, Fe, Cu, Ag as Metal M)

Figure 3:
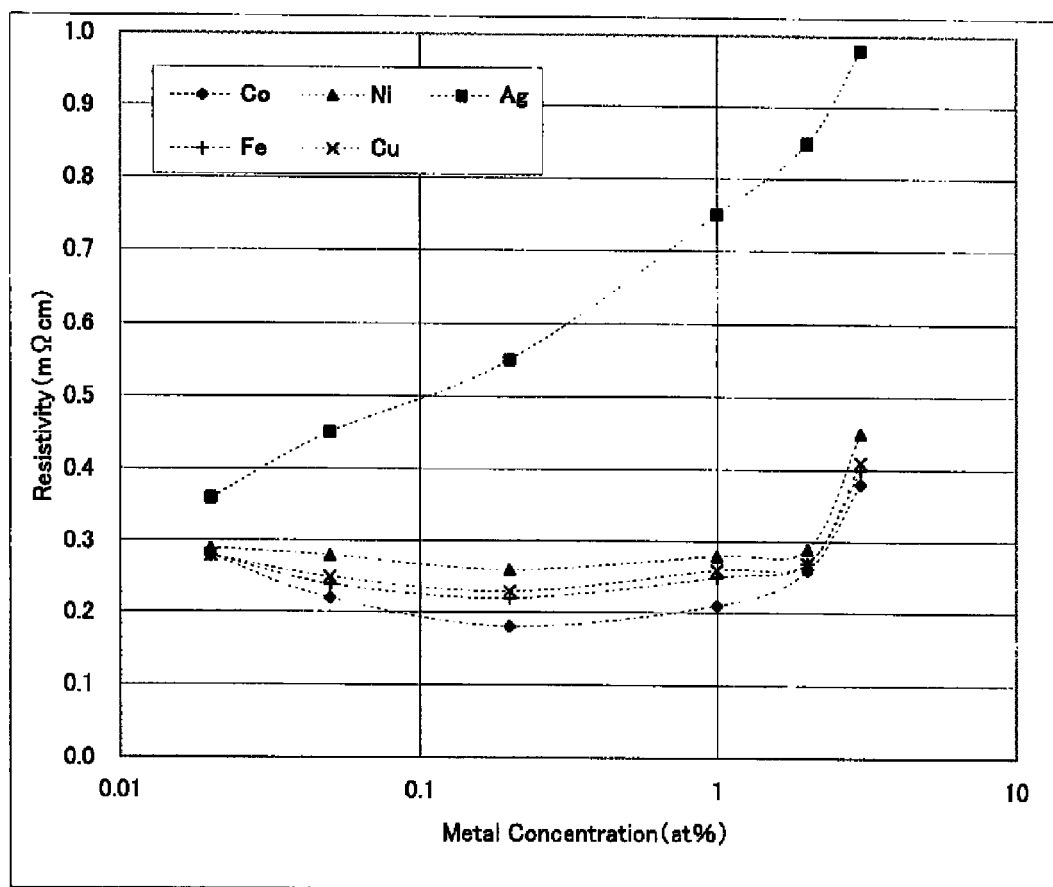
FIG. 3 is a diagram of the correlation of Ga and resistivity in each of the cases where a metal element selected from Co, Ni, Ag, Fe and Cu was added.

When using zinc oxide (ZnO) as the principal component, including Ga as the element to become the n-type dopant to zinc oxide, and using metal M (Co, Ni, Fe, Cu) showing favorable wettability with zinc oxide, as shown in Table 1, the reduction in resistivity was confirmed with the appropriate additive amount. The results are shown in FIG. 3. Nevertheless, as shown in foregoing Comparative Example 1, it was also found that the addition of Ag had the opposite effect of increasing the film resistance.

Although all of the foregoing Examples and Comparative Examples only show the confirmation test of independently adding metal M (Co, Ni, Fe, Cu), respectively, showing favorable wettability with zinc oxide, the same results were obtained even when these elements were added in multiples. Moreover, with respect to the amount of Ga as the n-type dopant, the additive amount which results in the lowest resistance level was obtained in advance, and metal M (Co, Ni, Fe, Cu) was further added based on the foregoing additive amount to measure the resistivity.

Accordingly, if the Ga amount is within the appropriate range of 3 to 6 at %, the resistivity reduction effect can similarly be acknowledged by double doping metal M (Co, Ni, Fe, Cu) having favorable wettability with zinc oxide. Specifically, the resistivity will be lower than the case of independently adding Ga to ZnO. The present invention covers all of the foregoing aspects.

Example 2

(Characteristics Confirmation Test 7)

The respective raw material powders of zinc oxide and aluminum oxide ($Al_2O_3$) were weighed so that the atomicity ratio of ZnO and Al as their constituent elements will be, as shown in sample numbers 101 to 105 of Table 2, in the range of ZnO:Al=99.80 to 95.00:0.200 to 5.000. In other words, the atomic concentration ratio of Al in relation to the total of Al and ZnO is changed from 0.200 to 5.000 at %. The specific weights of the respective raw materials weighed can be easily sought based on the calculation from the foregoing atomicity ratio and molecular weight of each of the raw materials to be weighed.

After mixing the weighed raw materials, a zirconia ball having a diameter of 3 mm was used and the raw material powders were pulverized for approximately one hour with an attritor, sieved with a 60-mesh sieve, retained in a drying oven set to 120° C. for 24 hours, and the moisture in the raw materials was evaporated. The dried raw materials were additionally sieved with a 60-mesh sieve, and mixed for approximately 5 minutes with a warming blender so that the raw material powders were mixed uniformly in a sufficient manner.

Subsequently, 270 g of the mixed raw materials powders was filled in a small die having a diameter of 85 φmm, the temperature was increased at a rate of temperature increase of 10° C./min from room temperature to 950° C. and at a rate of temperature increase of 5° C./min from 950° C. to 1000° C. while flowing argon (Ar) gas, and, after the temperature reached 1000° C., the mixed raw material powders were retained as is for 30 minutes, and pressurized from a pressure of 0 to 300 kgf/cm in 10 minutes.

Then, after retaining the status of a temperature of 1000° C. and pressure of 300 kgf/cm² for 2 hours, the heating with the furnace was stopped, cooled naturally, and the pressure was lowered from 300 kgf/cm² to 0 kgf/cm² in 10 minutes when the temperature reached 100° C. The target removed from the furnace was processed into a disk shape having a diameter of 50 mm and a thickness of 7 mm to obtain a sputtering target.

The obtained target was subject to sputter deposition using Corning #1737 glass having a diameter of 4 inches and a thickness of 0.7 mm as the substrate, and with the sputter deposition conditions at an Ar atmosphere of 0.5 Pa, Ar flow rate of 12 sccm, substrate temperature of 200° C., distance between the substrate and target of 80 mm, and sputter power of 50 W, and by adjusting the deposition time so that the film thickness becomes approximately 150 nm. The film thickness of the obtained film was measured with a profilometer, and the film resistivity was evaluated with Hall measurement. The obtained results are shown in sample numbers 101 to 105 of Table 2.

TABLE 2

Data of Characteristics Confirmation (Al Dopant)

| Sample Number | ZnO Content [at %] | Al Content [at %] | Co Content [at %] | Ni Content [at %] | Fe Content [at %] | Cu Content [at %] | Ag Content [at %] | Resistivity [mΩcm] |
|---|---|---|---|---|---|---|---|---|
| 101 | 99.80 | 0.200 | 0 | 0 | 0 | 0 | 0 | 0.65 |
| 102 | 99.50 | 0.500 | 0 | 0 | 0 | 0 | 0 | 0.49 |
| 103 | 98.00 | 2.000 | 0 | 0 | 0 | 0 | 0 | 0.33 |
| 104 | 96.50 | 3.500 | 0 | 0 | 0 | 0 | 0 | 0.42 |
| 105 | 95.00 | 5.000 | 0 | 0 | 0 | 0 | 0 | 0.85 |
| 106 | 97.98 | 2.000 | 0.02 | 0 | 0 | 0 | 0 | 0.28 |
| 107 | 97.95 | 1.999 | 0.05 | 0 | 0 | 0 | 0 | 0.24 |
| 108 | 97.80 | 1.996 | 0.20 | 0 | 0 | 0 | 0 | 0.20 |
| 109 | 97.02 | 1.980 | 1.00 | 0 | 0 | 0 | 0 | 0.23 |
| 110 | 96.04 | 1.960 | 2.00 | 0 | 0 | 0 | 0 | 0.28 |
| 111 | 95.06 | 1.940 | 3.00 | 0 | 0 | 0 | 0 | 0.45 |
| 112 | 97.98 | 2.000 | 0 | 0.02 | 0 | 0 | 0 | 0.32 |
| 113 | 97.95 | 1.999 | 0 | 0.05 | 0 | 0 | 0 | 0.30 |
| 114 | 97.80 | 1.996 | 0 | 0.20 | 0 | 0 | 0 | 0.28 |
| 115 | 97.02 | 1.980 | 0 | 1.00 | 0 | 0 | 0 | 0.30 |
| 116 | 96.04 | 1.960 | 0 | 2.00 | 0 | 0 | 0 | 0.32 |
| 117 | 95.06 | 1.940 | 0 | 3.00 | 0 | 0 | 0 | 0.55 |
| 118 | 95.48 | 4.499 | 0 | 0 | 0.02 | 0 | 0 | 0.29 |
| 119 | 95.45 | 4.498 | 0 | 0 | 0.05 | 0 | 0 | 0.25 |
| 120 | 95.31 | 4.491 | 0 | 0 | 0.20 | 0 | 0 | 0.22 |
| 121 | 94.55 | 4.455 | 0 | 0 | 1.00 | 0 | 0 | 0.25 |
| 122 | 93.59 | 4.410 | 0 | 0 | 2.00 | 0 | 0 | 0.29 |
| 123 | 92.64 | 4.365 | 0 | 0 | 3.00 | 0 | 0 | 0.47 |
| 124 | 95.48 | 4.499 | 0 | 0 | 0 | 0.02 | 0 | 0.30 |
| 125 | 95.45 | 4.498 | 0 | 0 | 0 | 0.05 | 0 | 0.26 |
| 126 | 95.31 | 4.491 | 0 | 0 | 0 | 0.20 | 0 | 0.23 |
| 127 | 94.55 | 4.455 | 0 | 0 | 0 | 1.00 | 0 | 0.27 |
| 128 | 93.59 | 4.410 | 0 | 0 | 0 | 2.00 | 0 | 0.30 |
| 129 | 92.64 | 4.365 | 0 | 0 | 0 | 3.00 | 0 | 0.49 |
| 130 | 97.98 | 2.000 | 0 | 0 | 0 | 0 | 0.02 | 0.40 |
| 131 | 97.95 | 1.999 | 0 | 0 | 0 | 0 | 0.05 | 0.45 |
| 132 | 97.80 | 1.996 | 0 | 0 | 0 | 0 | 0.20 | 0.60 |
| 133 | 97.02 | 1.980 | 0 | 0 | 0 | 0 | 1.00 | 0.80 |
| 134 | 96.04 | 1.960 | 0 | 0 | 0 | 0 | 2.00 | 0.90 |
| 135 | 95.06 | 1.940 | 0 | 0 | 0 | 0 | 3.00 | 0.98 |

Figure 2:
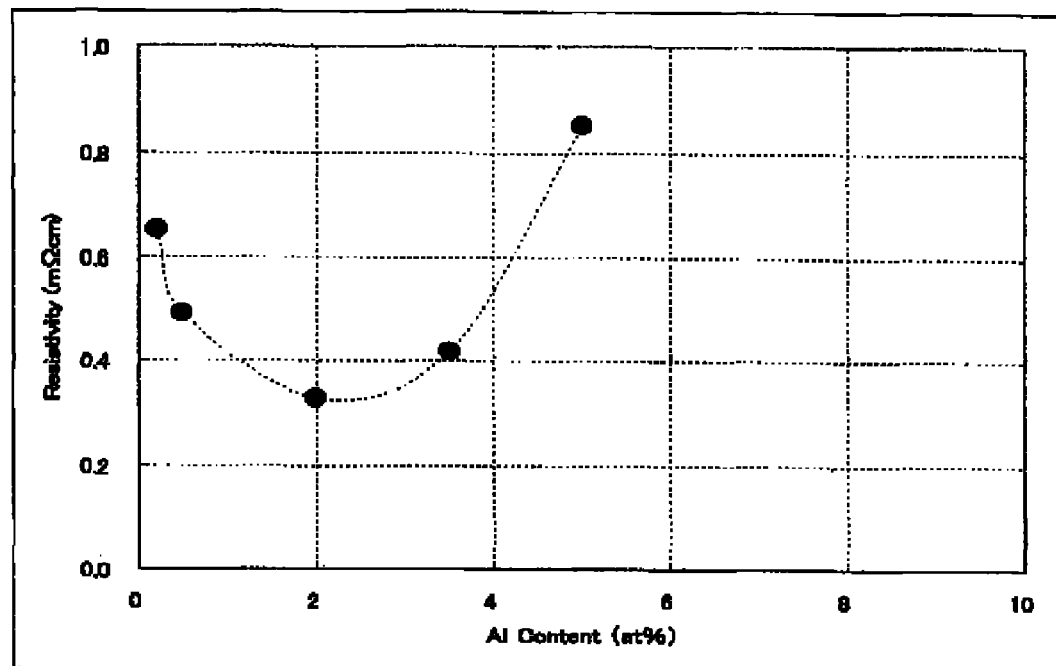
FIG. 2 is a diagram of the correlation of the Al concentration and resistivity.

When adding aluminum to zinc oxide, it is possible to review the transition of the film resistivity. As shown in sample numbers 101 to 105 of Table 2, when the Al content is 0.200 at %, the film resistivity is 0.65 mΩcm and the resistivity is high. Nevertheless, the film resistivity decreases in accordance with the increase of the Al content, and, when the Al content is 2.000 at %, the film resistivity was lowest at 0.33 mΩcm. Subsequently, the film resistivity increased as a result of increasing the Al content, and the film resistivity became 0.85 mΩcm with the Al content at 5.000 at %. FIG. 2 is a graph showing the results.

Like this, it is evident that the addition of an appropriate amount of aluminum to zinc oxide is extremely useful in decreasing the film resistivity. Nevertheless, if the additive amount is small, or excessive, it is evident from the foregoing Characteristics Confirmation Test that it does not contribute to the reduction of the film resistivity.

Then, as shown in sample numbers 101 to 104 of Table 2 and in FIG. 2, it was found that the effective amount of aluminum to be added is 0.500 to 3.500 at %, and the most effective amount of gallium to be added is 2.000 at %.
(Characteristics Confirmation Test 8)

Although the foregoing Characteristics Confirmation Test 7 confirmed that the addition of aluminum to zinc oxide is extremely effective for decreasing the film resistivity, and the most effective amount of aluminum to be added is 2.000 at %. Nevertheless, even with the addition of aluminum as described above, it is only possible to achieve film resistivity of roughly 0.33 mΩ cm, and this is not necessarily the level of resistivity that is comparable to conventional ITO.

Thus, cobalt was added to zinc oxide and aluminum as the metal of the present invention for improving the wettability. Specifically, as shown in sample numbers 106 to 111 of Table 2, the respective raw material powders of zinc oxide, aluminum oxide ($Al_2O_3$), and cobalt were weighed so that the atomicity ratio of Co in relation to the total amount of ZnO, Al, and Co as its constituent elements was in the range of 0.02 to 3.00.

The specific weights of the respective raw materials weighed can be easily sought based on the calculation from the foregoing atomicity ratio and molecular weight of each of the raw materials to be weighed. Incidentally, here, the atomic concentration of Al in relation to the total atomicity of Al and ZnO was set to the optimal value of 2.0 at % based on the data of the foregoing Characteristics Confirmation Test 2.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 1. The film thickness of the obtained film was measured with a profilometer, and the film resistivity was evaluated with Hall measurement. The obtained results are also shown in Table 2.

Consequently, the resistivity became 0.28 mΩcm with the Co content at 0.02 at %, and was lower than the film resistivity of 0.30 mΩcm in the case of independently adding aluminum to zinc oxide, and showed improvement. The resistivity decreased even further in accordance with the increase of the Co content, and the resistivity became the lowest value of 0.20 mΩcm with the Co content at 0.20 at %. This is a prominent example resulting from the effect of adding Co, and yielded an effect of obtaining low resistivity comparable to ITO. Subsequently, the resistivity showed an increasing trend in accordance with the increase of the Co content. Then, the resistivity became 0.28 mΩcm with the Co content at 2.00 at %.

Nevertheless, the resistivity became 0.45 mΩcm with the Co content at 3.00 at %, and became higher than the film resistivity of 0.33 mΩcm in the case of independently adding aluminum to zinc oxide. Consequently, it has been found that the excessive addition of Co is not favorable. Accordingly, when adding cobalt to zinc oxide and aluminum, it is desirable that the Co content to be added is 2.00 at % or less in which the effect of the addition of Co is evident, and it is clear that the lower limit of Co addition is preferably the Co content being 0.05 at % or greater in which the effect of the addition of Co is evident.
(Characteristics Confirmation Test 9)

Next, nickel was added to zinc oxide and aluminum as the metal of the present invention for improving the wettability. Specifically, as shown in sample numbers 112 to 117 of Table 2, the respective raw material powders of zinc oxide, aluminum oxide ($Al_2O_3$), and nickel were weighed so that the atomicity ratio of Ni in relation to the total amount of ZnO, Al, and Ni as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 8, the atomic concentration of Al in relation to the total atomicity of Al and ZnO was set to the optimal value of 2.000 at % based on the data of the foregoing Characteristics Confirmation Test 7.

After mixing the weighed raw materials, sintering raw material powder was prepared under the same conditions as the foregoing Characteristics Confirmation Test 7, additionally subject to pressure sintering, and processed into a disk shape to obtain a sputtering target.

The obtained target was used to perform sputter deposition under the same conditions as the foregoing Characteristics Confirmation Test 1. The film thickness of the obtained film was measured with a profilometer, and the film resistivity was evaluated with Hall measurement. The obtained results are also shown in sample numbers 112 to 117 of Table 2.

Consequently, the resistivity became 0.32 mΩcm with the Ni content at 0.02 at %, and was slightly lower than the film resistivity of 0.33 mΩcm in the case of independently adding aluminum to zinc oxide, and showed improvement. The resistivity decreased even further in accordance with the increase of the Ni content, and the resistivity became the lowest value of 0.28 mΩcm with the Ni content at 0.20 at %. Subsequently, the resistivity showed an increasing trend in accordance with the increase of the Ni content. Then, the resistivity became 0.32 mΩcm with the Ni content at 2.00 at %.

As described above, the film resistivity became 0.28 mΩcm with the Ni concentration at 0.2 at %, and showed the lowest value in the Ni concentration range, and this is a prominent example resulting from the effect of adding Ni. Accordingly, Ni also has a value of 5.4 of P as the parameter showing wettability, which is lower than the 6 prescribed by the present invention, and the resistivity reduction effect through the addition of Ni has been acknowledged. In comparison to the case of Co, although it could be said that the effect is rather weak, it has been confirmed that a sufficient resistivity reduction effect was still achieved.

The resistivity became 0.55 mΩcm with the Ni content at 3.00 at %, and became higher than the film resistivity of 0.33 mΩcm in the case of independently adding aluminum to zinc oxide. Consequently, it has been found that the excessive addition of Ni is not favorable. Accordingly, when adding nickel to zinc oxide and aluminum, it is desirable that the Ni content to be added is 2.00 at % or less in which the effect of the addition of Ni is evident, and it is clear that the lower limit of Ni addition is preferably the Ni content being 0.05 at % or greater in which the effect of the addition of Ni is evident.
(Characteristics Confirmation Test 10)

Next, iron was added to zinc oxide and aluminum as the metal of the present invention for improving the wettability. That is, shown in sample numbers 118 to 123 of Table 2, the respective raw material powders of zinc oxide, aluminum oxide ($Al_2O_3$), and iron were weighed so that the atomicity ratio of Fe in relation to the total amount of ZnO, Al, and Fe as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 8, the atomic concentration of Al in relation to the total atomicity of Al and ZnO was set to the optimal value of 2.000 at % based on the data of the foregoing Characteristics Confirmation Test 2.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 7. The film thickness of the obtained film was measured with a profilometer, and the film resistivity was evaluated with Hall measurement. The obtained results are also shown in sample numbers 118 to 123 of Table 2.

Consequently, the resistivity became 0.29 mΩcm with the Fe content at 0.02 at %, and was lower than the film resistivity of 0.33 mΩcm in the case of independently adding aluminum to zinc oxide, and showed improvement. The resistivity decreased even further in accordance with the increase of the Fe content, and the resistivity became the lowest value of 0.22 mΩcm with the Fe content at 0.20 at %. Subsequently, the resistivity showed an increasing trend in accordance with the increase of the Fe content. Then, the resistivity became 0.29 mΩcm with the Fe content at 2.00 at %.

Nevertheless, the resistivity became 0.47 mΩcm with the Fe content at 3.00 at %, and became higher than the film resistivity of 0.33 mΩcm in the case of independently adding aluminum to zinc oxide. Consequently, it has been found that the excessive addition of Fe is not favorable. Accordingly, when adding iron to zinc oxide and aluminum, it is desirable that the Fe content to be added is 2.00 at % or less in which the effect of the addition of Fe is evident, and it is clear that the lower limit of Fe addition is preferably the Fe content being 0.05 at % or greater in which the effect of the addition of Fe is evident.

(Characteristics Confirmation Test 11)

Next, copper was added to zinc oxide and aluminum as the metal of the present invention for improving the wettability. Specifically, as shown in sample numbers 124 to 129 of Table 2, the respective raw material powders of zinc oxide, aluminum oxide ($Al_2O_3$), and copper were weighed so that the atomicity ratio of Cu in relation to the total amount of ZnO, Al, and Cu as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 8, the atomic concentration of Al in relation to the total atomicity of Al and ZnO was set to the optimal value of 2.000 at % based on the data of the foregoing Characteristics Confirmation Test 2.

After mixing the weighed raw materials, sintering raw material powder was prepared under the same conditions as the foregoing Characteristics Confirmation Test 1, additionally subject to pressure sintering, and processed into a disk shape to obtain a sputtering target.

The obtained target was used to perform sputter deposition under the same conditions as the foregoing Characteristics Confirmation Test 7. The film thickness of the obtained film was measured with a profilometer, and the film resistivity was evaluated with Hall measurement. The obtained results are similarly shown in sample numbers 124 to 129 of Table 2.

Consequently, the resistivity became 0.30 mΩcm with the Cu content at 0.02 at %, and was lower than the film resistivity of 0.33 mΩcm in the case of independently adding aluminum to zinc oxide, and showed improvement. The resistivity decreased even further in accordance with the increase of the Cu content, and the resistivity became the lowest value of 0.23 mΩcm with the Cu content at 0.20 at %. Subsequently, the resistivity showed an increasing trend in accordance with the increase of the Cu content. Then, the resistivity became 0.30 mΩcm with the Cu content at 2.00 at %.

Nevertheless, the resistivity became 0.49 mΩcm with the Cu content at 3.00 at %, and became higher than the film resistivity of 0.33 mΩcm in the case of independently adding aluminum to zinc oxide. Consequently, it has been found that the excessive addition of Cu is not favorable. Accordingly, when adding iron to zinc oxide and aluminum, it is desirable that the Cu content to be added is 2.00 at % or less in which the effect of the addition of Cu is evident, and it is clear that the lower limit of is Cu addition is preferably the Cu content being 0.05 at % or greater in which the effect of the addition of Cu is evident.

Comparative Example 2

(Characteristics Confirmation Test 12)

Next, by way of comparison silver was added to zinc oxide and aluminum as the metal of the present invention for improving the wettability. Specifically, as shown in sample numbers 130 to 135 of Table 2, the respective raw material powders of zinc oxide, aluminum oxide ($Al_2O_3$), and silver were weighed so that the atomicity ratio of Ag in relation to the total amount of ZnO, Al, and Ag as its constituent elements was in the range of 0.02 to 3.00.

The specific weights of the respective raw materials weighed can be easily sought based on the calculation from the foregoing atomicity ratio and molecular weight of each of the raw materials to be weighed. As with Characteristics Confirmation Test 8, the atomic concentration of Al in relation to the total atomicity of Al and ZnO was set to the optimal value of 2.000 at % based on the data of the foregoing Characteristics Confirmation Test 2.

After mixing the weighed raw materials, sintering raw material powder was prepared under the same conditions as the foregoing Characteristics Confirmation Test 7, additionally subject to pressure sintering, and processed into a disk shape to obtain a sputtering target.

The obtained target was used to perform sputter deposition under the same conditions as the foregoing Characteristics Confirmation Test 7. The film thickness of the obtained film was measured with a profilometer, and the film resistivity was evaluated with Hall measurement. The obtained results are also shown in sample numbers 130 to 135 of Table 2.

Consequently, the resistivity became 0.40 mΩcm with the Ag content at 0.02 at %, and was higher than the film resistivity of 0.33 mΩcm in the case of independently adding aluminum to zinc oxide, and was inferior. The resistivity gradually increased in accordance with the increase of the Ag content, and the resistivity became 0.98 mΩcm with the Ag content at 3.00 at %, and became higher than the film resistivity of 0.33 mΩcm in the case of independently adding aluminum to zinc oxide. Consequently, it has been found that the addition of Ag is not preferable.

As described above, the film resistivity as a result of adding Ag showed a different tendency in comparison to the cases of adding Co, Ni, Fe, and Cu. In other words, in the case of Ag, since the parameter P showing the wettability is relatively high at 14.3, the wettability with zinc oxide is not favorable, and, even when added, if the addition is in high concentration, the film resistivity becomes higher in comparison to the case of not adding Ag at all.

If the additive amount is reduced, the adverse effect of adding Ag gradually becomes smaller, and nears the film resistivity in the case of not adding Ag. Accordingly, based on the Comparative Examples, if the parameter of the metal to be added is large, there is no effect of addition, at 5.4 of the Ni parameter, in which vicinity is found to be close to the upper limit of yielding the effect of achieving low resistivity based on the metal effect. Then, the upper limit of the appropriate range of the parameter will be 6 as prescribed in the preset invention.

(Result of Using Al as n-Type Dopant and Adding Co, Ni, Fe, Cu, Ag as Metal M)

Figure 4:
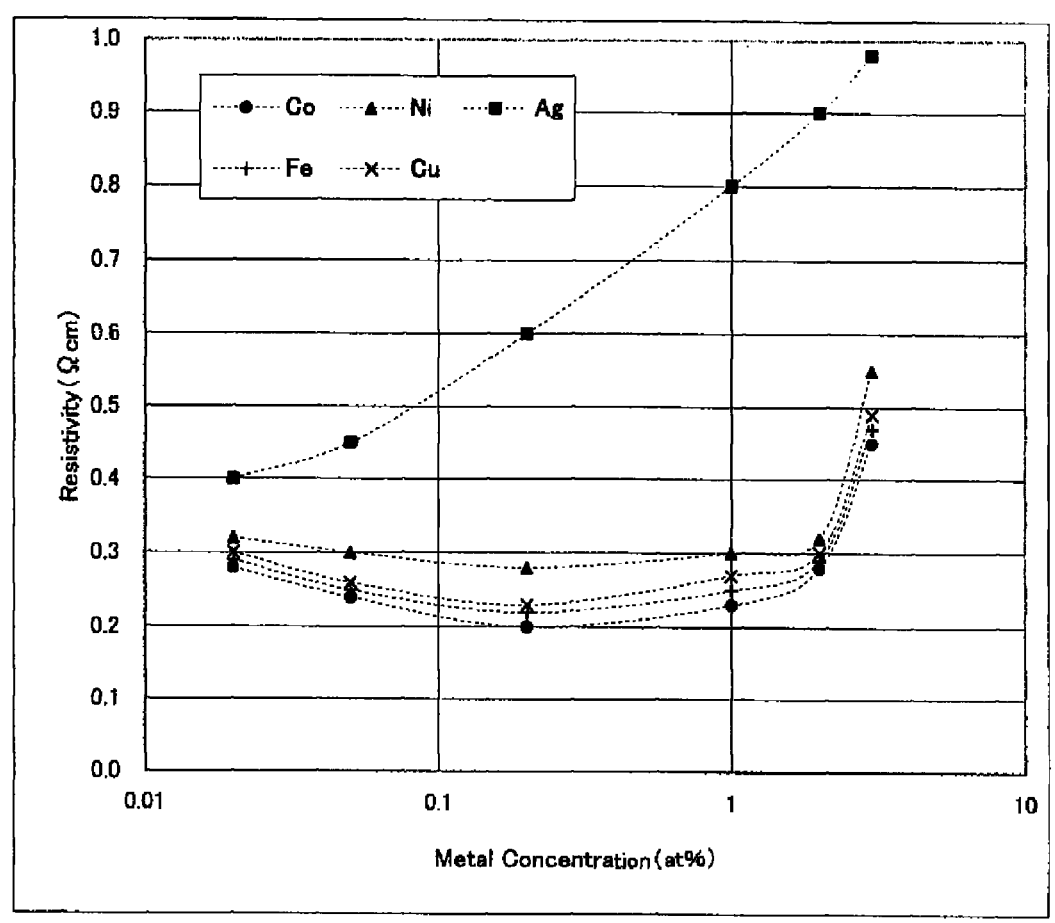
FIG. 4 is a diagram of the correlation of Al and resistivity in each of the cases where a metal element selected from Co, Ni, Ag, Fe and Cu was added.

When using zinc oxide (ZnO) as the principal component, including Al as the element to become the n-type dopant to zinc oxide, and using metal M (Fe, Cu) showing favorable wettability with zinc oxide, as shown in Table 2, the reduction in resistivity was confirmed with the appropriate additive amount. The results are shown in FIG. 4. Nevertheless, as shown in foregoing Comparative Example 2, it was also found that the addition of Ag had the opposite effect of increasing the film resistance.

Although all of the foregoing Examples and Comparative Examples only show the confirmation test of independently adding metal M (Co, Ni, Fe, Cu), respectively, showing favorable wettability with zinc oxide, the same results were obtained even when these elements were added in multiples. Moreover, with respect to the amount of Al as the n-type dopant, the additive amount which results in the lowest resistance level was obtained in advance, and metal M (Co, Ni, Fe, Cu) was further added based on the foregoing additive amount to measure the resistivity.

Accordingly, if the Al amount is within the appropriate range of 3 to 6 at %, the resistivity reduction effect can similarly be acknowledged by double doping metal M (Co, Ni, Fe, Cu) having favorable wettability with zinc oxide. Specifically, the resistivity will be lower than the case of independently adding Al to ZnO. The present invention covers all of the foregoing aspects.

As described above, whether the n-type dopant is Ga or Al, by adding metal (M) with favorable wettability as prescribed in the present invention in a prescribed concentration range, resistivity of the zinc oxide transparent electric conductor can be reduced. Since this effect is caused by the wettability of the metal and zinc oxide, there is no reason that this effect will not be yielded in cases where the n-type dopant is other than Ga or Al, and it should be naturally understood that the technical concept of the present invention exhibits similar effects with other n-type dopants as claimed in the scope of claims of the present invention.

As described above, the present invention is extremely effective as a transparent electric conductor in that a low-resistivity, large-area transparent electric conductor that could not be realized with conventional methods can be realized without using In, which is an expensive raw material with concern of resource depletion, by performing sputter-deposition to a zinc oxide target.

The invention claimed is:

1. A zinc oxide transparent electric conductor having zinc oxide (ZnO) as its principal component, containing an element to become an n-type dopant to zinc oxide, containing metal M in which $P(P=(\Delta G^0+\Delta Hx(M))/RT$, wherein $\Delta G^0$ is the standard free energy change of redox reaction of metal M and zinc oxide, $\Delta Hx(M)$ is the heat of dissolution of zinc as a constituent metal element of zinc oxide to metal M, R is the gas constant, and T is the temperature) as a parameter showing the wettability with zinc oxide is 6 or less and in which its resistivity is smaller than the resistivity of zinc oxide added with the n-type dopant, and wherein concentration of metal M in relation to the total atomicity of zinc and the n-type dopant and metal M, which are all metal atoms configuring the zinc oxide transparent electric conductor, is 0.05 to 2.0 at %.

2. The zinc oxide transparent electric conductor according to claim 1, wherein the n-type dopant is gallium (Ga), and the concentration in relation to the total atomicity of zinc oxide and Ga is 3 to 6 at %.

3. The zinc oxide transparent electric conductor according to claim 2, wherein metal M is one or more types of elements selected from the group consisting of cobalt (Co), nickel (Ni), iron (Fe) and copper (Cu).

4. The zinc oxide transparent electric conductor according to claim 1, wherein the n-type dopant is aluminum (Al), and the concentration in relation to the total atomicity of zinc oxide and Al is 0.5 to 3.5 at %.

5. The zinc oxide transparent electric conductor according to claim 4, wherein metal M is one or more types of elements selected from cobalt (Co), nickel (Ni), iron (Fe) or copper (Cu).

6. The zinc oxide transparent electric conductor according to claim 1, wherein metal M is one or more types of elements selected from the group consisting of cobalt (Co), nickel (Ni), iron (Fe) and copper (Cu).

7. A sputtering target for forming a zinc oxide transparent electric conductor having zinc oxide (ZnO) as its principal component, containing an element to become an n-type dopant to zinc oxide, containing metal M in which $P(P=(\Delta G^0+\Delta Hx(M))/RT$, wherein $\Delta G^0$ is the standard free energy change of redox reaction of metal M and zinc oxide, $\Delta Hx(M)$ is the heat of dissolution of zinc as a constituent metal element of zinc oxide to metal M, R is the gas constant, and T is the temperature) as a parameter showing the wettability with zinc oxide is 6 or less and in which its resistivity is smaller than the resistivity of zinc oxide added with the n-type dopant, and wherein concentration of metal M in relation to the total atomicity of zinc and the n-type dopant and metal M, which are all metal atoms configuring the zinc oxide transparent electric conductor, is 0.05 to 2.0 at %.

8. The sputtering target for forming a zinc oxide transparent electric conductor according to claim 7, wherein the n-type dopant is gallium (Ga), and the concentration in relation to the total atomicity of zinc oxide and Ga is 3 to 6 at %.

9. The sputtering target according to claim 8, wherein metal M is one or more types of elements selected from the group consisting of cobalt (Co), nickel (Ni), iron (Fe) and copper (Cu).

10. The sputtering target for forming a zinc oxide transparent electric conductor according to claim 7, wherein the n-type dopant is aluminum (Al), and the concentration in relation to the total atomicity of zinc oxide and Al is 0.5 to 3.5 at %.

11. The sputtering target for forming a zinc oxide transparent electric conductor according to claim 10, wherein metal M is one or more types of elements selected from cobalt (Co), nickel (Ni), iron (Fe) or copper (Cu).

12. The sputtering target according to claim 7, wherein metal M is one or more types of elements selected from the group consisting of cobalt (Co), nickel (Ni), iron (Fe) and copper (Cu).

13. A method of producing a sputtering target for forming a zinc oxide transparent electric conductor having zinc oxide (ZnO) as its principal component, including the steps of respectively weighing raw material powders of zinc oxide powder, oxide powder of an element to become an n-type dopant to zinc oxide, and powder of metal M in which $P(P=(\Delta G^0+\Delta Hx(M))/RT$, wherein $\Delta G^0$ is the standard free energy change of redox reaction of metal M and zinc oxide, $\Delta Hx(M)$ is the heat of dissolution of zinc as a constituent metal element of zinc oxide to metal M, R is the gas constant, and T is the temperature) as a parameter showing the wettability with zinc oxide is 6 or less and in which its resistivity is smaller than the resistivity of zinc oxide added with the n-type dopant so that concentration of metal M in relation to the total atomicity of zinc and the n-type dopant and metal M, which are all metal atoms configuring the zinc oxide transparent electric conductor, becomes 0.05 to 2.0 at %, mixing the powders, and performing pressure sintering thereto in order to form a solid target.

14. The method of producing a sputtering target for forming a zinc oxide transparent electric conductor according to claim 13, wherein the n-type dopant is gallium (Ga), and gallium oxide powder is mixed so that the concentration in relation to the total atomicity of zinc oxide and Ga will be 3 to 6 at %.

15. The method according to claim 14, wherein one or more types of powders selected from the group consisting of cobalt (Co) powder, nickel (Ni) powder, iron (Fe) powder and copper (Cu) powder is used as metal M.

16. The method of producing a sputtering target for forming a zinc oxide transparent electric conductor according to claim 13, wherein the n-type dopant is aluminum (Al), and aluminum oxide powder is mixed so that the concentration in relation to the total atomicity of zinc oxide and Al will be 0.5 to 3.5 at %.

17. The method of producing a sputtering target for forming a zinc oxide transparent electric conductor according to claim 16, wherein one or more types of powders selected from cobalt (Co) powder, nickel (Ni) powder, iron (Fe) powder or copper (Cu) powder is used as metal M.

18. The method according to claim 13, wherein one or more types of powders selected from the group consisting of cobalt (Co) powder, nickel (Ni) powder, iron (Fe) powder and copper (Cu) powder is used as metal M.

* * * * *

UNITED STATES PATENT AND TRADEMARK OFFICE
CERTIFICATE OF CORRECTION

PATENT NO. : 8,007,693 B2
APPLICATION NO. : 12/307380
DATED : August 30, 2011
INVENTOR(S) : Masakatsu Ikisawa et al.

It is certified that error appears in the above-identified patent and that said Letters Patent is hereby corrected as shown below:

Column 8, line 26 "warming" should read "waring".

Column 15, line 8 "warming" should read "waring".

Column 15, line 57 "cm" should read "$cm^2$".

Signed and Sealed this
Twenty-eighth Day of February, 2012

David J. Kappos
*Director of the United States Patent and Trademark Office*